United States Patent [19]
Lee et al.

[11] Patent Number: 5,768,193
[45] Date of Patent: Jun. 16, 1998

[54] BIT-REFRESHABLE METHOD AND CIRCUIT FOR REFRESHING A NONVOLATILE FLASH MEMORY

[75] Inventors: Peter W. Lee, Saratoga, Calif.; Hsing-Ya Tsao; Fu-Chang Hsu, both of Hsin-Chu, Taiwan

[73] Assignee: Aplus Integrated Circuits, Inc., Saratoga, Calif.

[21] Appl. No.: 745,034

[22] Filed: Nov. 7, 1996

Related U.S. Application Data

[63] Continuation-in-part of Ser. No. 664,639, Jun. 17, 1996.

[51] Int. Cl.$^6$ .................................................. G11C 16/06
[52] U.S. Cl. .......................... 365/185.25; 365/185.12; 365/185.33
[58] Field of Search .................... 365/185.25, 185.11, 365/185.12, 185.22, 185.29, 185.33

[56] References Cited

U.S. PATENT DOCUMENTS

| | | | |
|---|---|---|---|
| 4,698,787 | 10/1987 | Mukherjee et al. | 365/185 |
| 4,949,309 | 8/1990 | Rao | 365/218 |
| 5,097,444 | 3/1992 | Fong | 365/185 |
| 5,109,361 | 4/1992 | Yim et al. | 365/218 |
| 5,185,718 | 2/1993 | Rinerson et al. | 365/185 |
| 5,191,556 | 3/1993 | Radjy | 365/235 |
| 5,239,505 | 8/1993 | Fazio et al. | 365/185 |
| 5,347,486 | 9/1994 | Urai | 365/185 |
| 5,365,486 | 11/1994 | Schreck | 365/222 |
| 5,375,094 | 12/1994 | Naruke | 365/222 |
| 5,396,459 | 3/1995 | Arakawa | 365/185 |
| 5,574,684 | 11/1996 | Tomoeda | 365/185.25 |

*Primary Examiner*—David C. Nelms
*Assistant Examiner*—Son Mai
*Attorney, Agent, or Firm*—Flehr Hohbach Test Albritton & Herbert LLP

[57] ABSTRACT

In a method and circuit for refreshing a flash memory with a memory array, data corresponding to that stored in a memory cell of the memory array is read by applying a read voltage thereto. Thereafter, an erase verify voltage lower than the read voltage is applied to the memory array, and conduction of the memory cell is sensed. Based on non-conduction of the memory cell and the data of the memory cell, the memory cell is selectively discharged to compensate for undesired charge gain. Subsequently, a program verify voltage higher than the read voltage is applied to the memory array, and conduction of the memory cell is sensed. Based on conduction of the memory cell and the data of the memory cell, the memory cell is selectively charged to compensate for undesired charge loss. A method and circuit for initiating the refresh operation automatically is also disclosed.

19 Claims, 10 Drawing Sheets

BIT-REFRESHABLE METHOD AND CIRCUIT FOR REFRESHING A NONVOLATILE FLASH MEMORY

CROSS-REFERENCE TO RELATED APPLICATION

This is a continuation-in-part (CIP) application of co-pending U.S. patent application Ser. No. 8/664,639, entitled "Flash Memory Read/Write Controller," and filed on Jun. 17, 1996. This application incorporates the parent case by reference.

BACKGROUND OF THE INVENTION

1. Field of the Invention

The invention relates to a method and circuit for refreshing a nonvolatile flash memory, more particularly to a bit-refreshable method and circuit for refreshing a flash electrically erasable programmable read only memory (EEPROM).

2. Description of the Related Art

A conventional flash EEPROM includes a memory array which comprises a plurality of memory cell transistors that are arranged in a matrix of rows and columns. Memory transistors in the same row have shared word lines, while memory cells in the same column have shared bit lines.

Writing of a memory cell usually comprises two procedures: a programming procedure and an erasing procedure. These procedures are accomplished by raising and lowering the transistor threshold voltage, i.e. charging and discharging the memory cell, respectively. Data stored in a memory cell is determined by the transistor threshold voltage. The writing operation corresponds to changing the threshold voltage of the memory cells, such as by Fowler-Nordheim (F-N) tunneling and channel hot-electron (CHE) injection. As such, electrons are injected into a floating gate from a channel or diffusion region to increase the threshold voltage, or injected from the floating gate to the diffusion region to decrease the threshold voltage.

In a typical flash EEPROM, problems, such as word line stress, bit line stress, read disturb and long-term charge loss, are usually experienced and adversely affect the reliability of the EEPROM. These problems arise due to the fact that the presence of shared word lines and bit lines may result in disturbance to non-selected memory cells during the read, program and erase procedures. For example, the word line of a selected less-charged memory cell is raised when charging the latter by CHE injection or F-N tunneling. However, the charging operation may disturb non-selected more-charged memory cells on the same word line by removing some electrons from the floating gate to the control gate to result in a larger electric field between the control gate and the floating gate. Word line disturb may also occur when a high voltage is applied to a word line such that a non-selected less-charged memory cell which is connected to the word line receives electrons from the channel region by tunneling to result in a larger electric field between the floating gate and the channel region. Furthermore, application of a high negative voltage on a word line may also cause disturbance to non-selected more-charged memory cells on the word line because of the larger electric field between the floating gate and the substrate.

Bit line stress of a non-selected more-charged memory cell can occur due to removal of electrons from the floating gate to the drain diffusion when a high voltage is applied to the bit line during a charge operation by CHE injection or a discharge operation by F-N tunneling.

A memory cell suffering from large write cycle stress will generate many electron/hole trap centers in the dielectric between the floating gate and the substrate. This will cause the threshold voltage to gradually converge to the intrinsic state, i.e. there are no charges in the floating gate, especially since dispersing of the trapped electrons/holes is accelerated by temperature. Therefore, the reliability of the memory cell deteriorates if no refresh function is applied, particularly if the memory cell is a multi-level memory cell.

Read disturb is relatively less serious as compared with write disturb due to the better read failure rate under lower bias voltage conditions. However, in some cases, the accumulated stress will cause the data stored in the memory cell to become invalid even if only the read operation and no write operation is performed.

The long-term charge loss mechanism shows that trapped electrons will tunnel through the dielectric in many ways. One probable cause of long-term charge loss is thermal activation. By direct tunneling, the availability of trapped electrons at the top thin oxide/nitride (ONO) interface on the interpoly oxide will gradually worsen to result in loss of charge.

No matter what type of disturbance has occurred, the adverse effects thereof will accumulate to cause deterioration of the flash EEPROM, thereby making the latter less reliable. Typically, the write cycle of a flash EEPROM memory cell is limited to 100,000 times. In a worst case condition, a memory cell which has been charged or discharged only once will experience severe stress. Most likely, there is no way to recover the memory cell from severe charge gain or loss. As such, there is a need to enhance tolerance of the flash EEPROM memory cell in order to withstand different disturbing mechanisms with the use of a refresh function to minimize data loss.

Presently, many refresh operations have been suggested to overcome the aforementioned data loss due to the different disturbing mechanisms. However, since conventional refresh operations are primarily based on the concept that unhealthy memory cells arise mainly from drain disturbance, i.e. charge loss is more serious than charge gain, the prior art are incapable of handling both charge gain and charge loss. Whether or not charge gain is more serious than charge loss depends on the threshold levels for the on and off states. In some cases, the on-state threshold level will be much lower than ground level for split gate-type or NAND-type memory arrays. As such, charge gain will be more serious than charge loss. Furthermore, even if the aforementioned drain disturbance can be solved, accumulation of word line stress can still result in non-selected memory cell error during reading.

Most of the current flash EEPROM refreshing schemes cannot refresh unhealthy discharged memory cells bit by bit since the discharge operation is a collective operation. In addition, repair of unhealthy discharged memory cells in the prior art usually entails the use of an extra off-chip memory or internal memory. For example, in U.S. Pat. No. 5,365,486, data in an entire page of the memory array is recorded in the extra memory during a refresh operation so that the recovery of unhealthy memory cells can be collectively performed via a discharge operation. After the discharge operation, recharging of the patterned data will be performed. The refreshing scheme taught in this patent has obvious drawbacks, such as increased system/memory cost and waste of time due to the recharging operation.

U.S. Pat. No. 5,375,094 discloses another conventional refresh scheme in which a refresh operation is conducted after every erase operation and in which off-state data are enhanced by over-programming. Recharging of off-state memory cells is performed regardless of whether the off-state memory cells are healthy or not. Such a recharging operation results in several drawbacks. First, accumulation of a higher threshold voltage will result in an increase in the discharge time. Second, accumulation of word line stress for the non-selected memory cells will occur. Finally, undesired electron traps will be generated in the dielectric by CHE injection.

SUMMARY OF THE INVENTION

Therefore, the main object of this invention is to provide a bit-refreshable method and circuit for refreshing a flash EEPROM which permits recovery from both charge gain and charge loss due to the different disturbing mechanisms in an efficient and relatively low cost manner.

Another object of this invention is to provide a refreshing method and circuit in which the refresh operation is initiated by a command set from an off-chip controller.

Still another object of this invention is to provide a refreshing method and circuit which utilizes a sequencer for internal refresh purposes.

Yet another object of this invention is to provide a refreshing method and circuit which can automatically detect, based on a presettable self-refreshing frequency, when the refresh operation is to be initiated.

A further object of this invention is to provide a refreshing method and circuit which can be applied to a flash memory with a multi-level memory array.

According to one aspect of this invention, a method of refreshing a flash memory with a memory array comprises the steps of:

reading data corresponding to that stored in a memory cell of the memory array by applying a read voltage thereto;

applying an erase verify voltage lower than the read voltage to the memory array;

sensing conduction of the memory cell and, based on non-conduction of the memory cell and the data of the memory cell, selectively discharging the memory cell to compensate for undesired charge gain;

applying a program verify voltage higher than the read voltage to the memory array; and sensing conduction of the memory cell and, based on conduction of the memory cell and the data of the memory cell, selectively charging the memory cell to compensate for undesired charge loss.

According to another aspect of this invention, a method of refreshing a flash memory with a multi-level memory array comprises the steps of:

reading data corresponding to that stored in a memory cell of the memory array;

generating a discharge enable signal associated with the memory cell;

generating a step count pattern which has incrementing step counts;

applying stepwise decreasing erase verify signals based on the incrementing step counts to the memory array for reading the memory cell;

comparing the data with a complement of the incrementing step counts, and resetting the discharge enable signal to a discharge inhibit signal when the data is greater than or equal to the complement of the incrementing step counts;

resetting the discharge enable signal to the discharge inhibit signal when the memory cell conducts after applying the erase verify signals corresponding to the incrementing step counts to the memory array;

if the discharge enable signal is still present after applying one of the erase verify signals to the memory array, discharging the memory cell so that a threshold voltage thereof becomes lower than said one of the erase verify signals to cure the memory cell of undesired charge gain; and after all of the incrementing step counts have been generated:

generating a charge inhibit signal associated with the memory cell;

generating a step count pattern which has decrementing step counts;

applying stepwise increasing program verify signals based on the decrementing step counts to the memory array for reading the memory cell;

comparing the data with a complement of the decrementing step counts, and resetting the charge inhibit signal to a charge enable signal when the data is greater than or equal to the complement of the decrementing step counts;

resetting the charge enable signal back to the charge inhibit signal when the memory cell does not conduct after applying the program verify signals corresponding to the decrementing step counts to the memory array; and if the charge enable signal is present after applying one of the program verify signals to the memory array, charging the memory cell so that the threshold voltage thereof becomes higher than said one of the program verify signals to cure the memory cell of undesired charge loss.

According to still another aspect of this invention, a method of initiating a refresh operation in a flash memory with a memory array and a refreshing circuit comprises the steps of:

(A) providing a non-volatile attribute memory having a first memory portion for storing a starting address, a second memory portion for storing a scanning mode bit, and a third memory portion for storing a write cycle record;

(B) during every power-on period, loading the starting address and the scanning mode bit in an address register and a scanning mode register, respectively; and (C) scanning the third memory portion of the attribute memory after each write cycle of the flash memory, including the sub-steps of:

(c1) loading the starting address from the address register into a scanning counter;

(c2) scanning the third memory portion of the attribute memory at an address corresponding to an address output of the scanning counter;

(c3) comparing data at scanned address of the attribute memory with the scanning mode bit;

(c4) if the data matches the scanning mode bit, and the scanned address is not a final address of the attribute memory, controlling the scanning counter to increment the address output thereof for scanning another address of the attribute memory and for comparing data at the another address with the scanning mode bit;

(c5) if the data does not match the scanning mode bit, writing at the scanned address such that the data thereat matches the scanning mode bit, and stopping the scanning of the attribute memory; and (c6) if the data matches the scanning mode bit, and the scanned address is a final address of the attribute memory, controlling the refreshing circuit to start the refresh operation for refreshing the memory array.

According to yet another aspect of this invention, a refreshing circuit for refreshing a flash memory with a multi-level memory array comprises:

a read-write controller including:
  a read/write circuit having: a master latch for latching data corresponding to that stored in a memory cell of the memory array; and a slave latch for generating a discharge enable signal associated with the memory cell; and
  a step counter for generating a step count pattern which has incrementing step counts;
a voltage generator coupled to the step counter and the memory array, the voltage generator applying stepwise decreasing erase verify signals based on the incrementing step counts from the step counter to the memory array for reading the memory cell;
the read/write circuit further having: a level comparator coupled to the master latch, the step counter and the slave latch, the level comparator comparing the data with a complement of the incrementing step counts, and resetting the discharge enable signal to a discharge inhibit signal when the data is greater than or equal to the complement of the incrementing step counts; and a sense amplifier coupled to the memory array and the slave latch, the sense amplifier sensing conduction of the memory cell after the voltage generator applies the erase verify signals corresponding to the incrementing step counts to the memory array and resetting the discharge enable signal to the discharge inhibit signal when the memory cell conducts;
the read/write controller further including a detecting circuit coupled to the slave latch for detecting presence of the discharge enable signal; and
a control circuit coupled to the master latch, the detecting circuit and the voltage generator, the control circuit controlling latching of the data by the master latch upon initiation of a refresh operation, the control circuit being controlled by the detecting circuit to control in turn the voltage generator to permit discharging of the memory cell so that a threshold voltage thereof becomes lower than one of the erase verify signals to cure the memory cell of undesired charge gain upon detection by the detecting circuit that the discharge enable signal is still present after application of said of the erase verify signals;
the slave latch further generating a charge inhibit signal associated with the memory cell;
the step counter further generating a step count pattern which has a plurality of decrementing step counts after generating all of the incrementing step counts;
the voltage generator further applying stepwise increasing program verify signals based on the decrementing step counts to the memory array for reading the memory cell;
the level comparator further comparing the data with a complement of the decrementing step counts and resetting the charge inhibit signal to a charge enable signal when the data is greater than or equal to the complement of the decrementing step counts;
the sense amplifier further resetting the charge enable signal back to the charge inhibit signal when the memory cell does not conduct after the voltage generator applies the program verify signals corresponding to the decrementing step counts to the memory array; and the detecting circuit further detecting presence of the charge enable signal after the voltage generator applies one of the program verify signals and controlling the control circuit to control, in turn, the voltage generator to permit charging of the memory cell so that the threshold voltage thereof becomes higher than said of the program verify signals to cure the memory cell of undesired charge loss.

According to a further aspect of this invention, an automatic circuit for initiating a refresh operation in a flash memory with a memory array and a refreshing circuit comprises:

a non-volatile attribute memory coupled to the refreshing circuit and having a first memory portion for storing a starting address, a second memory portion for storing a scanning mode bit, and a third memory portion for storing a write cycle record;

an address register coupled to the refreshing circuit and the attribute memory, the refreshing circuit loading the starting address into the address register during every power-on period;

a scanning mode register coupled to the refreshing circuit and the attribute memory, the refreshing circuit loading the starting mode bit into the scanning mode register during every power-on period; and a scanning counter coupled to the address register and the refreshing circuit;

the refreshing circuit loading the starting address from the address register into the scanning counter so as to scan the third memory portion of the attribute memory at an address corresponding to an address output of the scanning counter after each write cycle of the flash memory, the refreshing circuit comparing data at scanned address of the attribute memory with the scanning mode bit;

if the data matches the scanning mode bit, and the scanned address is not a final address of the attribute memory, the refreshing circuit controlling the scanning counter to increment the address output thereof for scanning another address of the attribute memory and for comparing data at the another address with the scanning mode bit;

if the data does not match the scanning mode bit, the refreshing circuit writing at the scanned address such that the data thereat matches the scanning mode bit, and stopping the scanning of the attribute memory; and if the data matches the scanning mode bit, and the scanned address is a final address of the attribute memory, the refreshing circuit initiating the refresh operation for refreshing the memory array.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
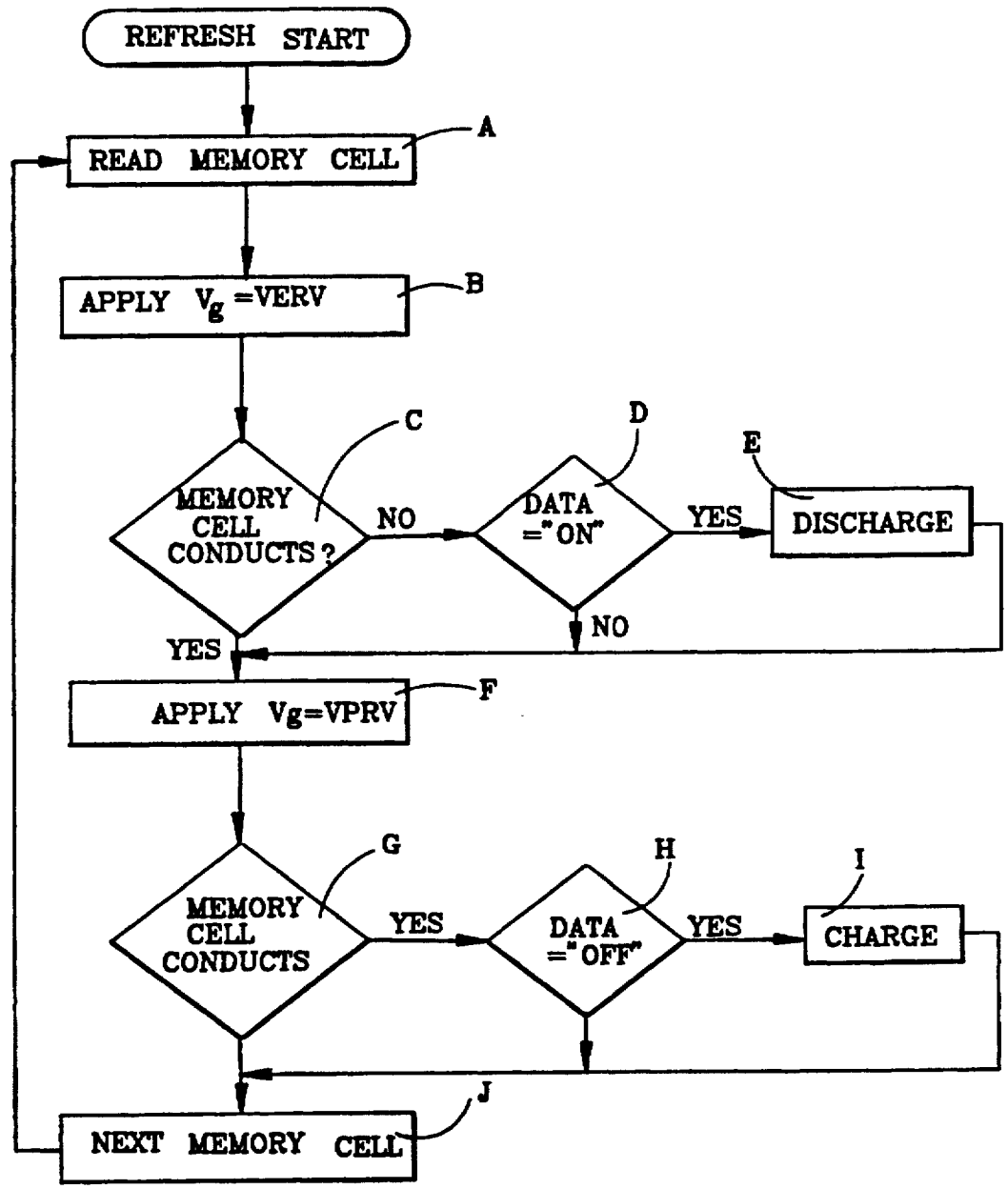
FIG. 1 is a flowchart of the refreshing method of this invention.

Before this invention is described in greater detail, it should be noted that like elements are denoted by the same reference numerals throughout the disclosure.

The method of refreshing a flash memory with a memory array of two or more levels in accordance with this invention is shown in FIG. 1. As shown, when the refresh operation is initiated, data corresponding to that stored in a memory cell of the memory array is read by applying a read voltage thereto (block A). An erase verify voltage, which is lower than the read voltage, is subsequently applied to the memory array (block B), and it is then sensed whether the memory cell conducts (block C). If the memory cell does not conduct even though it has been programmed to the "ON" state (block D), refreshing of the memory cell is performed by discharging the same to compensate for undesired charge gain (block E). Thereafter, a program verify voltage, which is higher than the read voltage, is applied to the memory array (block F), and it is then sensed whether the memory cell conducts (block G). If the memory cell conducts even though it has been programmed to the "OFF" state (block H), refreshing of the memory cell is performed by charging the same to compensate for undesired charge loss (block I). The refresh operation is then repeated for another memory cell of the memory array (block J).

Figure 2:
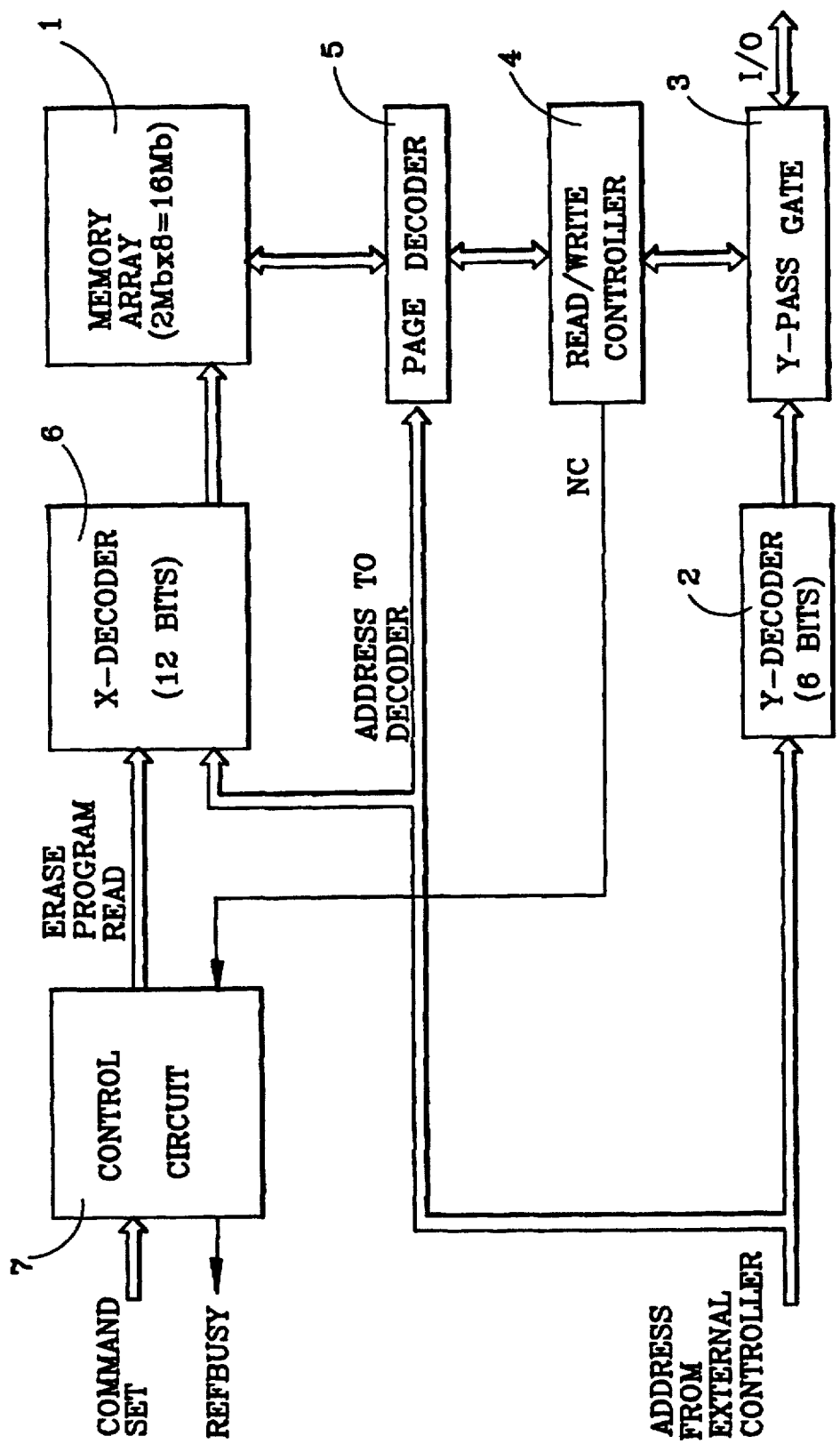
FIG. 2 is a schematic circuit block diagram of a flash EEPROM which incorporates the first preferred embodiment of a refreshing method and circuit according to this invention.

FIG. 2 illustrates a flash electrically erasable programmable read only memory (EEPROM) which incorporates the first preferred embodiment of a refreshing method and circuit according to this invention. As shown, the flash EEPROM includes a memory array 1, a Y-decoder 2, a Y-pass gate 3, a page decoder 5 and an X-decoder 6. The refreshing circuit consists of a read/write controller 4 and a control circuit 7.

Figure 3:
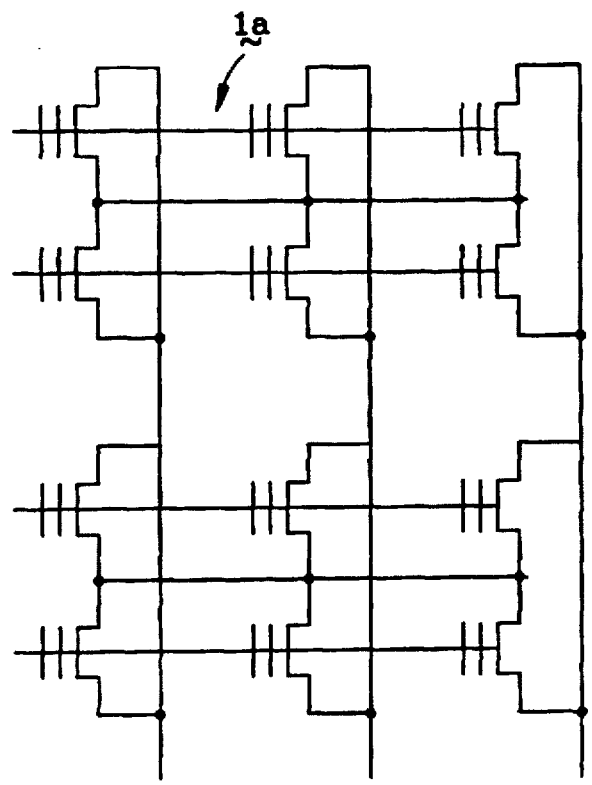
FIG. 3 illustrates a NOR plane memory array of the flash EEPROM shown in FIG. 2.
Figure 4:
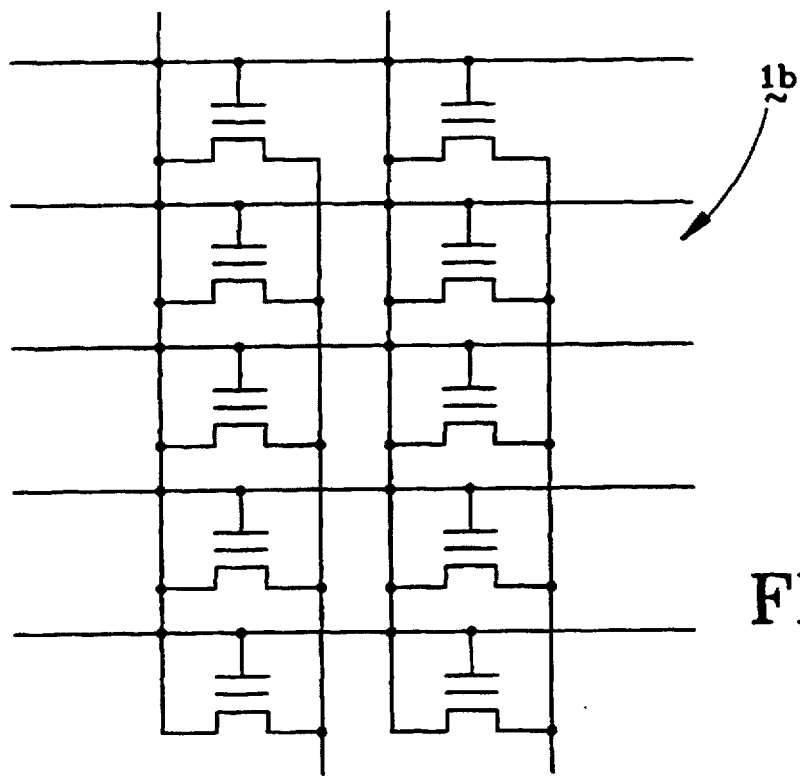
FIG. 4 illustrates an AND plane memory array of the flash EEPROM shown in FIG. 2.

In the embodiment of FIG. 2, the memory array 1 comprises 8M-bit four-level memory cell transistors arranged in 4096 rows and 2048 columns, thereby resulting in a density equivalent to that of 16M-bit two-level memory cell transistors. Memory cells in the same row have shared word lines, while memory cells in the same column have shared bit lines. The memory array 1 is both bit-programmable and bit-erasable and may be a NOR plane memory array 1a with source side CHE injection for programming and drain side F-N tunneling for erasure, as shown in FIG. 3, or an AND plane memory array 1b with drain side F-N tunneling for both programming and erasure, as shown in FIG. 4.

The Y-pass gate 3 couples the Y-decoder 2 and the I/O port to the memory array 1, and is coupled to the page decoder 5 by the read/write controller 4. The page decoder 5 is coupled to the bit lines of the memory array 1 such that the bit lines of the memory array 1 are selected upon reception by the Y-decoder 2 of external address signals from an off-chip controller (not shown).

The control circuit 7 receives a command set from the off-chip controller during the read, write and refresh operations. The control circuit 7 generates ERASE, PROGRAM and READ control signals that are received by the X-decoder 6. The control circuit 7 further generates the REFBUSY signal to the off-chip controller to inform the latter of the status of the refresh operation. The X-decoder 6, which is a word line decoder that is coupled to the word lines of the memory array 1, additionally receives external address signals from the off-chip controller for selecting one of the word lines of the memory array 1, and provides the different erase/program verify voltages and the read voltages to the accessed memory cells during a refresh operation in accordance with the control signals from the control circuit 7.

The read/write controller 4 is responsible for judging the conditions of the memory cells intelligently. If all of the memory cells in a tested part of the memory array 1 are good, the controller 4 will generate a signal (INC) to the control circuit 7. The control circuit 7 will then request for the refresh command set for another part of the memory array 1 from the off-chip controller so as to check the conditions of the memory cells thereat. If unhealthy memory cells are detected, i.e. the charge gain or loss made the threshold voltage higher or lower, the controller 4 will be activated to selectively charge or discharge the unhealthy memory cells internally. Thus, compared with conventional refreshing schemes, a marked improvement in memory cell endurance can be achieved since only appropriate ones of the memory cells are selectively charged or discharged and since data stored in healthy memory cells are left unchanged.

Figure 5:
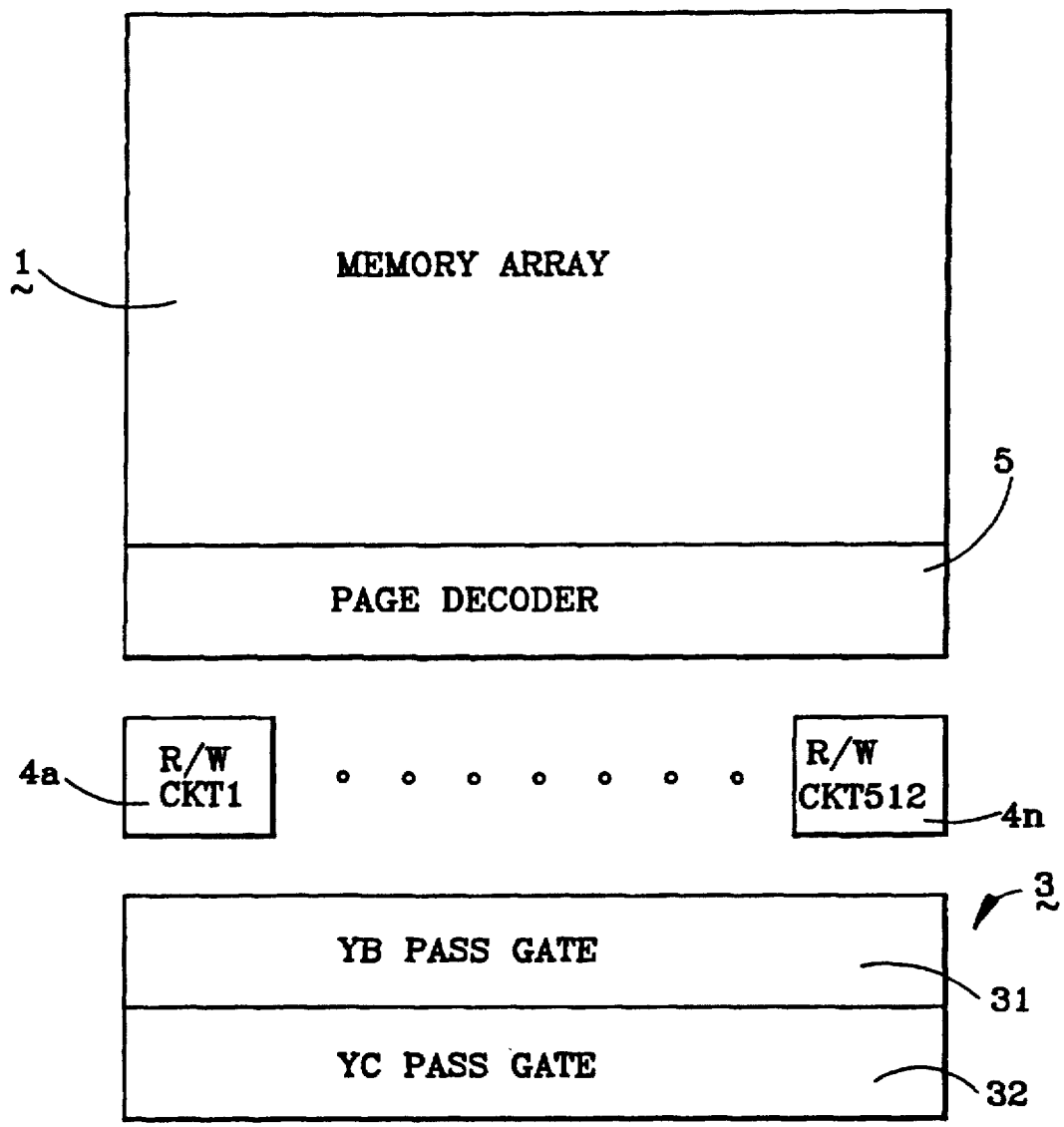
FIG. 5 depicts a multi-page organization of the memory array shown in FIG. 2.

Referring to FIG. 5, the read/write controller 4 includes a number of read/write circuits 4a–4n to reduce the writing time. In this embodiment, 512 read/write circuits 4a–4n are in use. The Y-pass gate 3 includes YB and YC pass gates 31, 32. The page decoder 5 selects one bit line out of a predetermined number (such as 4) of bit lines to be connected to the corresponding read/write circuits 4a–4n. The Y-pass gate 3 selects one byte of the read/write circuits 4a–4n to be connected to the I/O port. Therefore, the Y-decoder 2, the Y-pass gate 3 and the page decoder 5 cooperatively form a bit line decoder for the memory array 1.

The page decoder 5 serves to partition the word lines of the memory array 1 into several pages, thereby permitting the functions of page-load, page-erasure and page-programming. A "page" is defined as a predetermined number of memory cells which belong to a word line or to a portion of a word line, such as 64 bytes, etc. The page-operation means that all memory cells in a page can be processed at the same time. The size of a page is determined by how many read/write circuits 4a–4n are in use. Since each bit line has its own read/write circuit 4a–4n, the bit lines can be operated simultaneously. With the page-load operation, the off-chip controller can be free to do other tasks in a normal write cycle. The page-load cycle consists of loading a maximum of 64 bytes into the controller 4 before initiation of the internal write cycle. All data in the controller 4 can be written simultaneously during the write cycle.

It should be noted that, during a write cycle, the page decoder 5 will inhibit non-selected ones of the pages. During an erase cycle, however, the page decoder 5 connects all of the bit lines to the read/write circuits 4a–4n to permit simultaneous erasing of several word lines or the entire memory array 1. During a read operation of the memory array 1, the Y-decoder 2 will be enabled, and the Y-pass gate 3 is transparent for patterned data from the I/O port. The controller 4 can store data that is received from the I/O port through the Y-pass gate 3. The final latched data is determined by the state of the memory cell. During a refresh operation, however, the Y-decoder 2 will be disabled after reading, and the Y-pass gate 3 will no longer be transparent from the I/O port throughout the refresh operation. Thus, the program/erase verify procedure that is conducted during the refresh operation is a simple procedure which only involves internal reading, i.e. reading out data from the I/O port is unnecessary, for diagnosis purposes.

Figure 6:
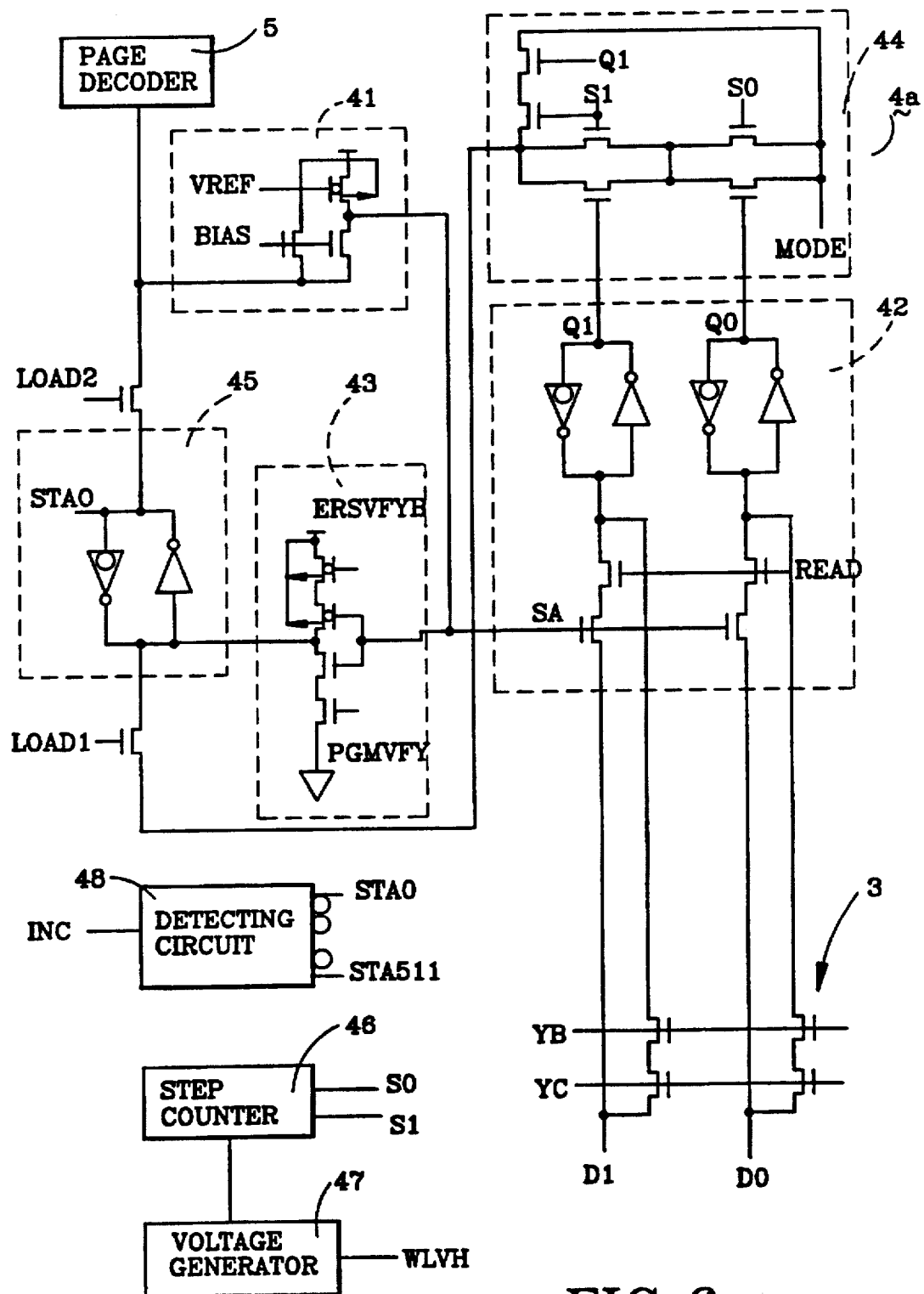
FIG. 6 illustrates a read/write circuit of a read/write controller of the first preferred embodiment.

Referring to FIG. 6, each read/write circuit 4a–4n of the controller 4 includes a sense amplifier 41 coupled to the page decoder 5, a master latch 42 coupled to the Y-pass gate 3, a data comparator 43, a level comparator 44 coupled to the master latch 42 and to a step counter 46 of the controller 4, and a slave latch 45. During a write cycle, the step counter 46 generates a step count pattern with a plurality of step counts to allow the read/write circuits 4a–4n to compare the complement of a current step count (S1, S0) with new data to be programmed into the memory array 1. The step counter 46 is coupled with a voltage generator 47 of the X-decoder 6 that provides a word line high voltage (WLHV) signal to the word lines of the memory array 1. The technique is to associate the new data with the WLHV signal for the erasing/programming procedure in order to determine whether the target threshold voltage of the selected memory cell for the present programming/erasing procedure is less than, equal to or greater than the new data.

The operation of the read/write circuit 4a–4n is based on page-load, page-erase (with selected data pattern), and page-program (with selected data pattern) to reduce the writing time and the unnecessary erasing/programming cycles, thereby reducing stressing of the memory cells. After a page of new data is loaded, the memory cells that need to be erased or programmed are automatically and directly erased or programmed without the pre-program option commonly used in known flash memories. The invention can also be used with a word-load, word-erase and word-program. Alternatively, the invention can be used with a bitload, bit-erase and bit-program. A detailed description pertaining to the structure and read and write cycle operations of the read/write circuits 4a–4n can be found in co-pending U.S. patent application Ser. No. 08/611,600, entitled "Flash Memory Read/Write Controller," the disclosure of which is incorporated herein by reference.

Figure 7:
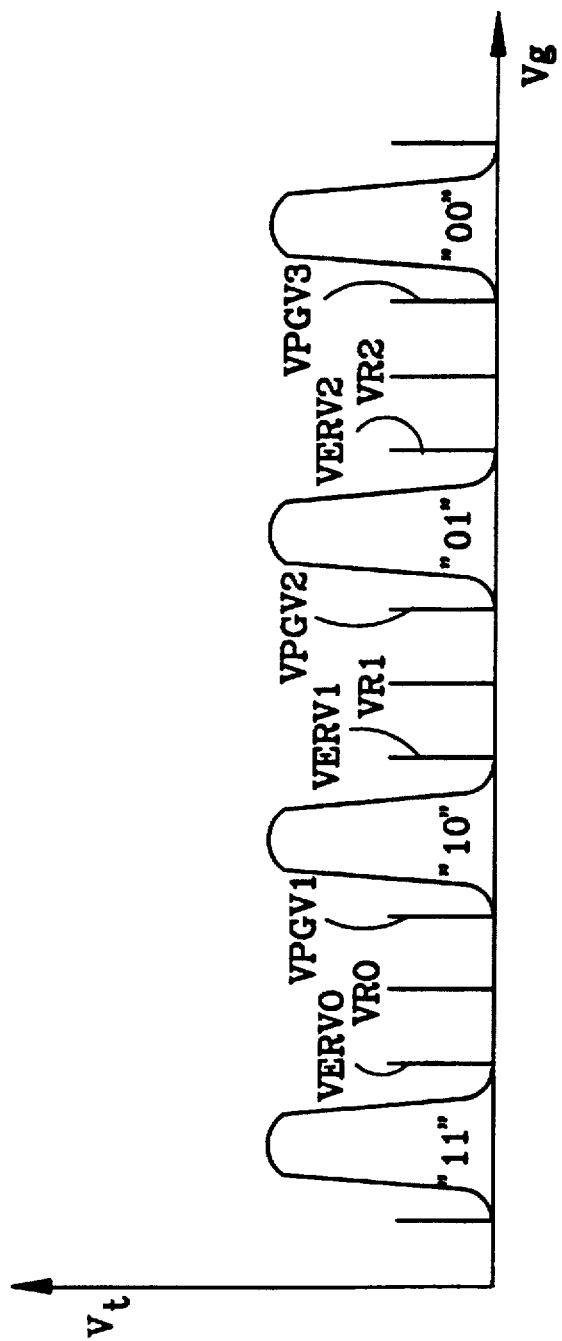
FIG. 7 illustrates the distribution of threshold voltages for a four-level memory cell of the memory array shown in FIG. 2.

FIG. 7 shows a threshold voltage distribution for a four-level memory cell. VR0, VR1 and VR2 indicate the stepwise read voltages. VPGV1, VPGV2 and VPGV3 are the program verify voltages for the charging operation. VERV0, VERV1 and VERV2 are the erase verify voltages for the discharging operation. The sensing margin of the sense amplifier 41 will depend on the difference between the read voltage and the extreme voltages of the threshold voltage distribution. If there is no refresh function, a gradual loss in the sensing margin will expedite deterioration of the multi-level memory cells.

During a read cycle, the voltage generator 47 applies a relatively high stepwise read voltage to the selected word line while the non-selected word lines are kept at ground level. When the stepwise read voltage reaches the threshold level of a memory cell, the memory cell is turned on, and the sense amplifier 41 of the corresponding read/write circuit 4a–4n will send SA=0 to the data comparator 43 (PGMVFY=1, ERSVFYB=0) to shut off the pass gates in the master latch 42. The current data in the memory cell is latched by the master latch 42 at this time. After all of the levels of the stepwise read voltage have been ramped, the final data can be obtained from the read/write circuits 4a–4n. With reference to FIGS. 6 and 7, in the following example, a memory cell having the third level "01" stored therein is read. When the step counter 46 generates the data pattern "11", the word line level will be raised from ground level to the read voltage VR0. Since the word line level does not exceed the "01" threshold voltage, the sense amplifier 41 sends SA=1 to the data comparator 43 and the master latch 42. The pass gate between the data lines (D1, D0) and the master latch 42 is kept transparent at this time. When the data pattern from the step counter 46 changes to "10", the word line level will be raised from VR0 to the read voltage VR1. Since the word line level still does not exceed the "01" threshold voltage, the sense amplifier 41 keeps sending SA=1 to the data comparator 43 and the master latch 42. When the data pattern from the step counter 46 changes to "01", the word line level will be raised from VR1 to the read voltage VR2. At this time, the word line level exceeds the "01" threshold voltage, the memory cell conducts to pull down the sense amplifier 41 to the low logic voltage. The "01" data pattern is then latched by the master latch 42. The data pattern from the step counter 46 changes to "00" afterward.

It should be noted that the Y-pass gate 3 is kept isolated throughout the sensing procedure for sensing the data stored in the memory cells and is turned on only when the sensing procedure is completed to permit reading of the newly latched data in a random or sequential manner. On the contrary, the pass gate that is located between the data lines (D/1, D0) and the master latch 42 is transparent throughout the sensing procedure and is turned off by the READ signal.

Table I illustrates the relationship between data at the data lines (D1, D0), data at the master latch (Q1, Q0), and the threshold level of the four-level memory cell. It should be noted that the higher the threshold level number, the higher will be the threshold voltage.

TABLE I

| D1 D0 | Q1 Q0 | Threshold Level |
|---|---|---|
| 00 | 11 | 4 |
| 01 | 10 | 3 |
| 10 | 01 | 2 |
| 11 | 00 | 1 |

Table II illustrates how a new data pattern is written into four four-level memory cells with an old data pattern stored therein:

TABLE II

| Q1 Q0 | old data (10) new data | old data (01) new data | old data (00) new data | old data (11) new data |
|---|---|---|---|---|
| Q1 Q0 | (01) | (10) | (11) | (11) |
| Discharge Operation S1 S0 | | | | |
| (00) | inhibit | inhibit | inhibit | inhibit |
| (01) | enable | inhibit | inhibit | inhibit |
| (10) | inhibit | inhibit | inhibit | inhibit |

TABLE II-continued

| Charge Operation S1 S0 | | | | |
|---|---|---|---|---|
| (10) | inhibit | inhibit | enable | inhibit |
| (01) | inhibit | enable | enable | inhibit |
| (00) | inhibit | inhibit | enable | inhibit |

The refresh operation proceeds in a manner similar to the write operation. The only difference is that data in the memory cells should be read out to the master latch 42 before proceeding with the charge and discharge procedures. The internal read operation, however, could take a longer time compared with the normal read operation described beforehand based on the assumption that a loss in the sensing margin occurred due to charge gain/loss. An unhealthy memory cell is defined as a memory cell which was inadequately charged or discharged during the write cycle. The diagnosis for unhealthy memory cells in the refresh operation is the same as the program and erase verification procedures in the write cycle. In the prior art, all memory cells in a block are erased and programmed with new data regardless of whether the original data in some of the memory cells are the same as the new data. On the contrary, the bit-selective program/erase procedure in this invention permits changing of data only when necessary, thereby avoiding unnecessary stressing of the memory cells, as shown in Table II.

Figure 8:
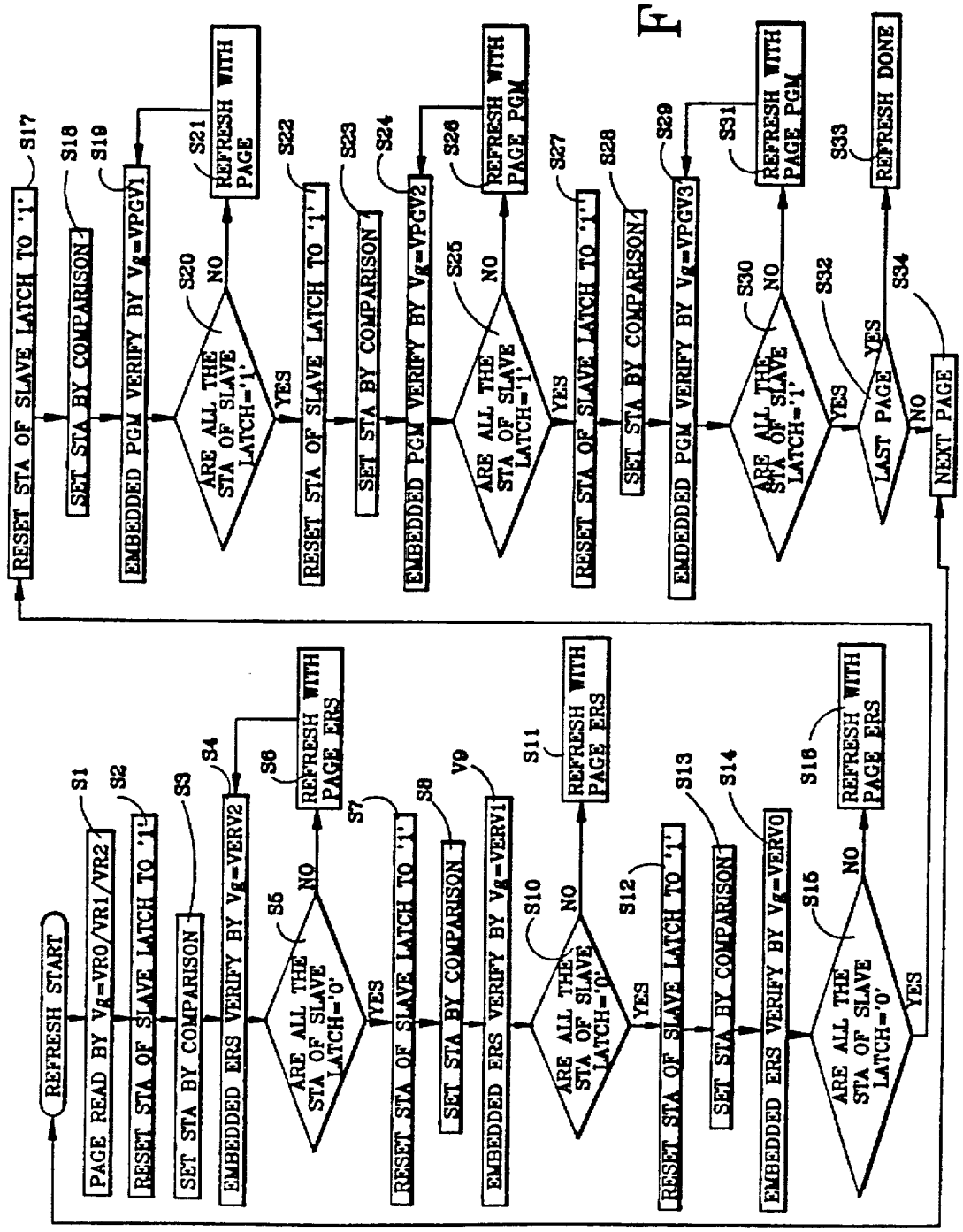
FIG. 8 is a flowchart of the refreshing method of the first preferred embodiment.

FIG. 8 illustrates a flowchart of the refresh operation for this embodiment. The refresh operation will now be explained with reference to FIGS. 6, 7 and 8. As shown in FIG. 8, at the start of the refresh operation, the control circuit 7 controls the voltage generator 47 so that the different read voltages VR0, VR1 and VR2 are applied stepwise to the word lines of the memory array 1 in order for data corresponding to that stored in the memory cells of a selected page can be latched by the master latch 42 of the read/write circuits 4a–4n in the manner described beforehand (block S1). The slave latch 45 of the read/write circuits 4a–4n are then reset to a discharge enable state (STA0=1) by the level comparator 44 (MODE=0, S0=S1=1, LOAD1=1) (block S2). Thereafter, the status of the slave latch 45 is set by the level comparator 44 by comparing the data (Q1, Q0) in the master latch 42 with the complement of the step count pattern (S1, S0) from the step counter 46 (block S3). Initially, the step count pattern (S1, S0) is 00. When the complement of the step count pattern (S1, S0) is greater than or equal to the data (Q1, Q0), the slave latch 45 is flipped to the discharge inhibit state (STA0=0, MODE=1). An erase verify operation is then performed by applying the internal erase verify voltage VERV2 to the selected word line of the memory array 1 so as to check the threshold levels of the memory cells thereat (block S4). If the threshold level is lower than the verify voltage VERV2, the tested memory cell conducts, and the associated sense amplifier 41 will send SA=0 to the data comparator 43 (PGMVFY=0, ERSVFYB=0) to flip the slave latch 45 to the discharge inhibit state (STA0=0). Otherwise, when the tested memory cell does not conduct, the sense amplifier 41 will send SA=1 to the data comparator 43 so that the state of the slave latch 45 remains unchanged. At this time, a detecting circuit 48 of the controller 4, which is coupled to the control circuit 7, detects the state of the slave latch 45 of all of the read/write circuits 4a–4n (block S5). If any of the slave latches 45 are in the discharge enable state (STA0=1), discharging of the associated memory cells are performed (block S6). Then, the erase verify operation is again performed by applying the internal erase verify voltage VERV2 to the selected word line of the memory array 1 (block S4). The discharge operation for discharging unhealthy charge gain cells can be page-based (such as 64 bytes) using F-N tunneling. The iterated discharge operation will not stop until all of the slave latches 45 are in the discharge inhibit state, or until a predetermined iterated discharge number is reached. At that time, the detecting circuit 48 generates the INC signal to the control circuit 4 to proceed with the refresh operation.

Blocks S7 to S11 and blocks S12 to S16 are similar to blocks S2 to S6. However, in blocks S7 to S11, the step count pattern (S1, S0) is 01, while the internal erase verify voltage is VERV1. For blocks S12 to S16, the step count pattern (S1, S0) is 10, and the internal erase verify voltage is VERV0.

Table III shows the relationship among the data pattern (Q1, Q0), the step count pattern (S1, S0), and the status of a slave latch 45 that is associated with a healthy memory cell during the discharge procedure of the refresh operation:

TABLE III

| S1 S0 | (00) | (01) | (10) |
|---|---|---|---|
| Q1 Q0 | | | |
| (00) | enable | enable | enable |
| (01) | enable | enable | inhibit |
| (10) | enable | inhibit | inhibit |
| (11) | inhibit | inhibit | inhibit |

The charge procedure of the refresh operation is generally similar to that of the discharge procedure. At the start of each charge procedure, the slave latches 45 are reset to a charge inhibit state (STA0=1) (block S17). Thereafter, the status of the slave latch 45 is set by the level comparator 44 by comparing the data (Q1, Q0) in the master latch 42 with the complement of the step count pattern (S1, S0) from the step counter 46 (block S18). Initially, the step count pattern (S1, S0) is 10. When the data (Q1, Q0) is greater than or equal to the complement of the step count pattern (S1, S0), the slave latch 45 will be flipped by the level comparator 44 to the charge enable state (STA0=0). A program verify operation is then performed by applying the internal program verify voltage VPGV1 to the selected word line of the memory array 1 so as to check the threshold levels of the memory cells thereat (block S19). If the threshold level is higher than the verify voltage VPGV1, the tested memory cell does not conduct, and the associated sense amplifier 41 will send SA=1 to the data comparator 43 (PGMVFY=1, ERSVFYB=1) to flip the slave latch 45 back to the charge inhibit state (STA0=1). Otherwise, if the tested memory cell conducts, the sense amplifier 41 will send SA=0 to the data comparator 43 so that the state of the slave latch 45 remains unchanged. At this time, the detecting circuit 48 detects the state of the slave latch 45 of all of the read/write circuits 4a–4n (block S20). If any of the slave latches 45 are in the charge enable state (STA0=0), charging of the associated memory cells are performed (block S21). Then, the program verify operation is again performed by applying the internal program verify voltage VPGV1 to the selected word line of the memory array 1 (block S19). The charge procedure for charging loss cells can be byte-by-byte based using CHE injection or page-based (such as 64 bytes) using F-N tunneling. As with the discharge procedure, the iterated charge procedure will continue until all of the slave latches 45 are in the charge inhibit state, or until a predetermined iterated charge number is reached. At that time, the detecting circuit 48 generates the INC signal to the control circuit 4 to proceed with the refresh operation. Blocks S22 to S26 and blocks S27 to S31 are similar to blocks S17 to S21. However, in blocks S22 to S26, the step count pattern (S1, S0) is 01, while the internal program verify voltage is VPGV2. For blocks S27 to S31, the step count pattern (S1, S0) is 00, and the internal program verify voltage is VPGV3.

Table IV shows the relationship among the data pattern (Q1, Q0), the step count pattern (S1, S0), and the status of a slave latch 45 that is associated with a healthy memory cell during the charge procedure of the refresh operation:

TABLE IV

| S1 S0 | (10) | (01) | (00) |
|---|---|---|---|
| Q1 Q0 | | | |
| (00) | inhibit | inhibit | inhibit |
| (01) | enable | inhibit | inhibit |
| (10) | enable | enable | inhibit |
| (11) | enable | enable | enable |

When the charge procedure at the highest level (program verify voltage =VPGV3) is completed, a decision is made as to whether the last page has been refreshed (block S32). If yes, the refresh operation is deemed to be completed (block S33). Otherwise, the refresh operation for a succeeding page is performed (block S34).

In this embodiment, the refresh function is initiated by a command set from the off-chip controller. Thus, external addresses are sequentially generated by the off-chip controller when going through all of the memory cells. The command set can be triggered by either a system timer or the end user, such as when the flash EEPROM is applied in a digital camera or cellular phone. Although such an arrangement will result in loading between the flash EEPROM and the off-chip controller, an advantage results in that there are less functional blocks fabricated in the flash EEPROM.

Figure 9:
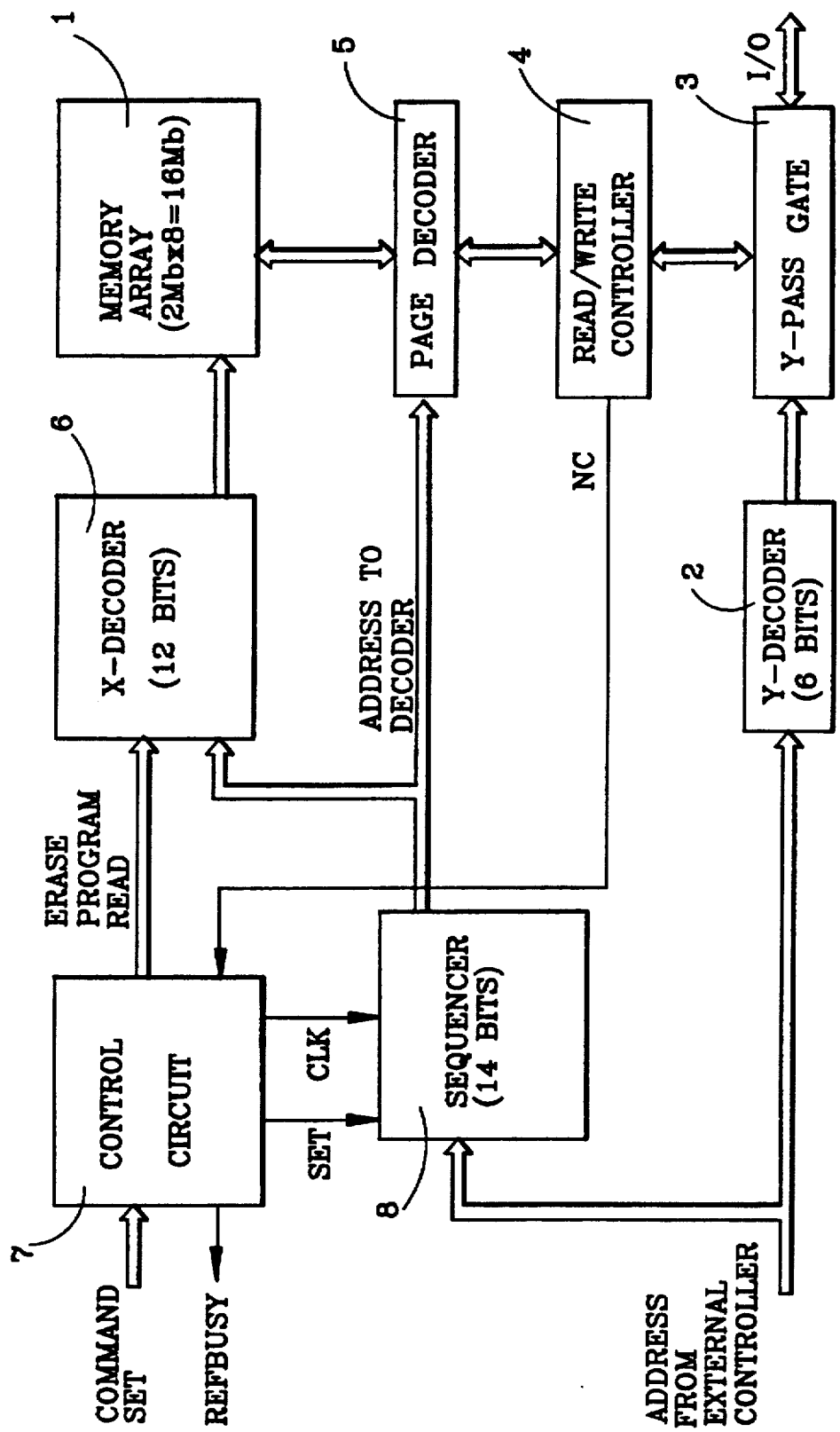
FIG. 9 is a schematic circuit block diagram of a flash EEPROM which incorporates the second preferred embodiment of a refreshing method and circuit according to this invention.

FIG. 9 illustrates the second preferred embodiment of a flash EEPROM according to this invention. As shown, the second preferred embodiment is substantially similar to the previous embodiment. However, the second preferred embodiment additionally comprises a sequencer 8 to reduce the loading burden of the off-chip controller. As such, the off-chip controller is free to perform other tasks during the internal refresh operation. The sequencer 8 is coupled to and controlled by the control circuit 7, and is further coupled to address inputs of the page decoder 5 and the X-decoder 6 so as to generate address data internally for accessing the memory cells of the memory array 1 during the refresh operation. The sequencer 8 is operable as a 14-bit asynchronous counter during the refresh operation, and as an address buffer during a normal read/write cycle. The sequencer 8 receives SET and CLK signals from the control circuit 7 during the refresh operation. The SET signal is applied to distinguish the refresh operation from the normal read/write cycle. The CLK signal is used to increment the sequencer 8.

Figure 10:
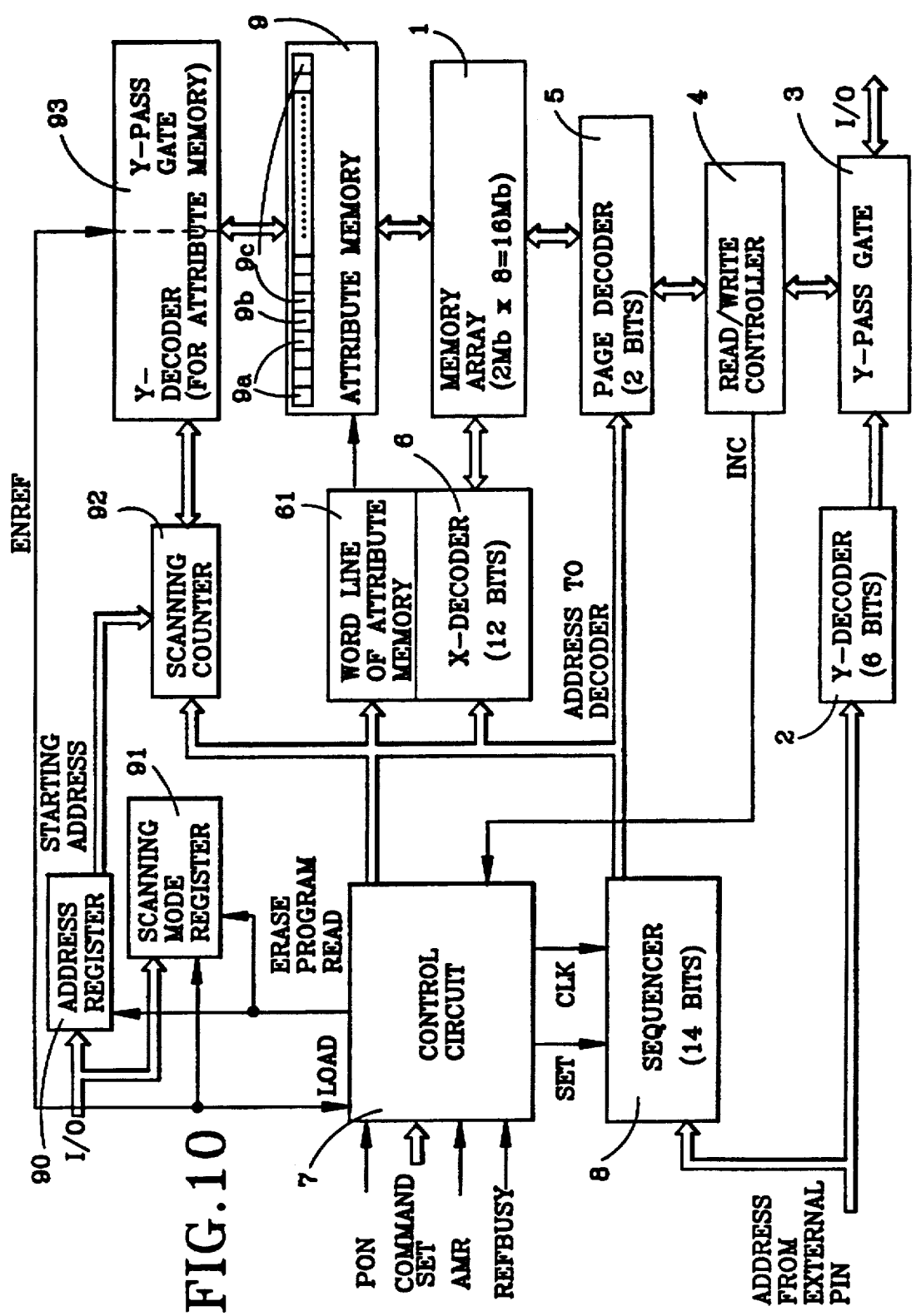
FIG. 10 is a schematic circuit block diagram of a flash EEPROM which incorporates the third preferred embodiment of a refreshing method and circuit according to this invention.

FIG. 10 illustrates the third preferred embodiment of a flash EEPROM according to this invention. The third preferred embodiment has an inherent self-refresh function and employs scanning of an attribute memory 9 after each write cycle to determine whether or not refreshing of the memory array 1 is to be performed. Like the second preferred embodiment, the flash EEPROM includes a sequencer 8 for going through all the memory cells in sequence and so that the diagnosis for unhealthy memory cells can be done step by step internally. The sequencer 8 is controlled by the SET and CLK signals from the control circuit 7. In this embodiment, the self-refresh function can be enabled during every power-on period. Moreover, like the first preferred embodiment, the use of command sets to initiate the refresh operation is also possible in this embodiment in order to offer added flexibility in dealing with the problems which result from the different disturbing mechanisms. Furthermore, the frequency of the refresh operation in this embodiment can be preset in order to match the actual condition of the memory array 1. Thus, waste of power consumption can be avoided since unnecessary refresh operations can be minimized.

As shown in FIG. 10, the automatic circuit for initiating the refresh operation comprises an attribute memory 9, an address register 90, a scanning mode register 91 and a scanning counter 92. The attribute memory 9 is tasked to record the write operation. In this embodiment, the attribute memory 9 comprises N (e.g., N=32) flash EEPROM two-level memory cells that are arranged in a row or column and that are grouped into three portions 9a, 9b, 9c. The first portion 9a includes four memory cells and is used for storing a starting address M (M<16<N) of the attribute memory 9. The second portion 9b includes one memory cell and is used for storing a scanning mode bit. The third portion 9c is used for storing a write cycle record therein.

The address register 91 and the scanning mode register 92 are coupled to the control circuit 7 and the attribute memory 9. The starting address M and the scanning mode bit are loaded from the attribute memory 9 to the address register 90 and the scanning mode register 91 by the control circuit 7 during every power-on period. During the power-on period, the control circuit 7 will enable the word line 61 of the attribute memory 9 in the X-decoder 6 and shut off the other word lines. The starting address M and the scanning mode bit will then be read out through the I/O port by the address register 90 and the scanning mode register 91 by the LOAD signal from the control circuit 7.

After the completion of a write cycle, a record is made in the third portion 9c of the attribute memory 9. The refreshing operation is enabled after a charge or discharge procedure of the attribute memory 9, depending upon the status of the scanning mode bit. Thus, it is possible to initiate the refreshing operation whenever the contents of the third portion 9c of the attribute memory 9 are all discharged. Alternatively, the refreshing operation can be performed whenever the contents of the third portion 9c of the attribute memory 9 are all charged.

In this embodiment, the scanning counter 92 (e.g., 5 bits) is coupled to the address register 90 and the control circuit 7 and is used to access the attribute memory 9. After each write cycle, there will be a checking procedure to determine the scanning mode and a scanning procedure to read the starting address M in the attribute memory 9. For example, if the scanning mode bit indicates that the refreshing operation is to be initiated when the contents of the third portion 9c of the attribute memory 9 are all charged, each charged memory cell of the third portion 9c will inform the control circuit 7 to skip the current memory cell and go to the next memory cell of the third portion 9c of the attribute memory 9. Once a discharged memory cell is detected, the control circuit 7 will perform a charging operation for the discharged memory cell. After verifying that the contents of the third portion 9c of the attribute memory 9 are all charged, meaning that the scanning counter 92 has counted (N-M) write cycles, the enable signal ENREF is generated via the Y-decoder and Y-pass gate 93 for the attribute memory 9 to inform the control circuit 7 to start over the self-refresh operation. As such, by varying the starting address M, the frequency of the refresh operation can be adjusted in order to match the actual condition of the memory array 1 and avoid waste of power consumption due to unnecessary refresh operations.

In this embodiment, the control circuit 7 not only receives the command set from the off-chip controller but also accepts an internal attribute memory reading (AMR) command after each write cycle. The control circuit 7 scans the attribute memory 9 via the scanning counter 92 whenever the control circuit 7 receives the AMR command.

Figure 11:
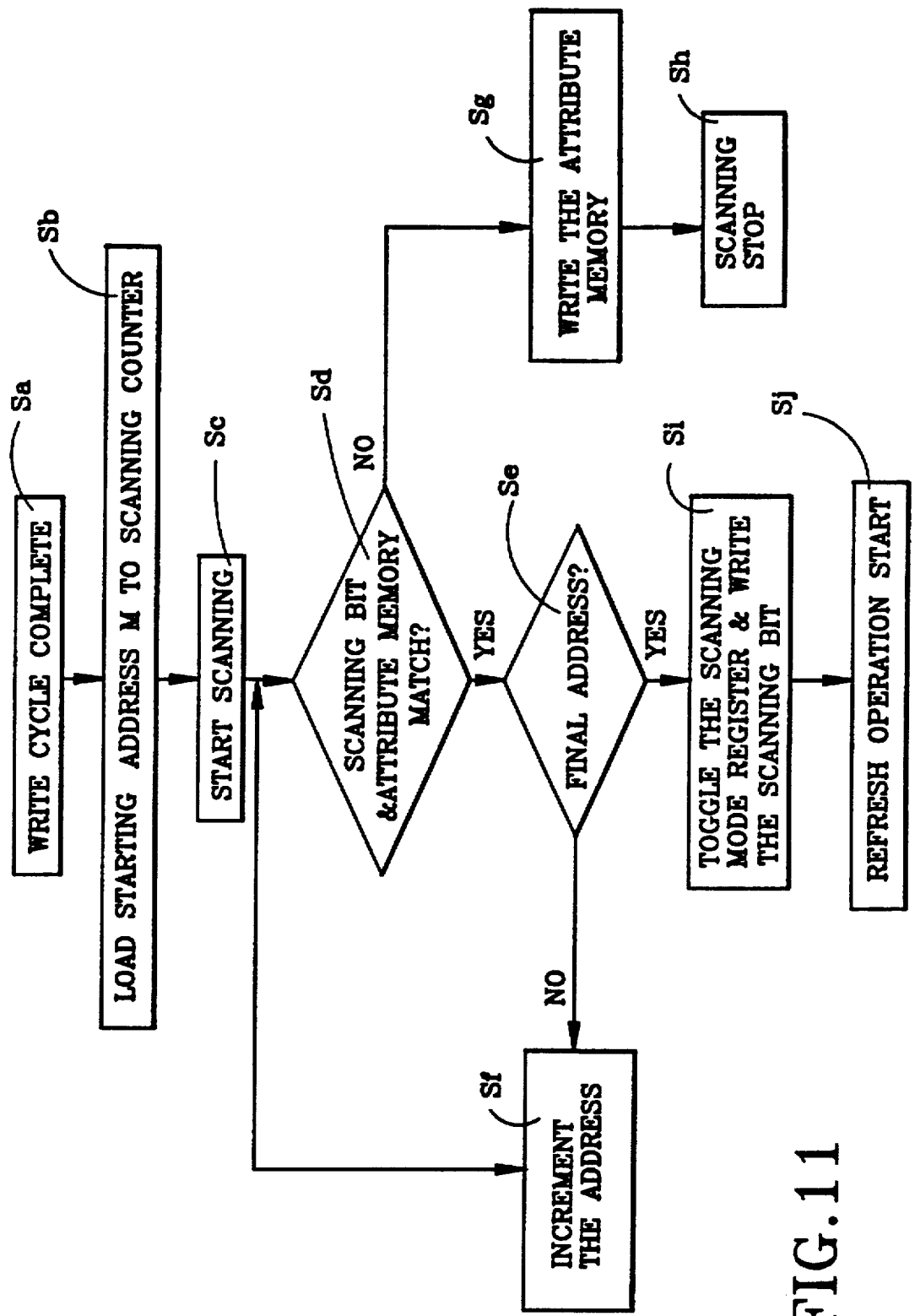
FIG. 11 is a flowchart illustrating how a refresh operation is initiated in the third preferred embodiment.

FIG. 11 illustrates a flowchart of the scanning procedure. With reference to FIGS. 10 and 11, whenever a write cycle is completed (block Sa), the starting address M in the address register 90 is loaded into the scanning counter 92 (block Sb). The control circuit 7 then begins scanning of the contents of the third portion 9c of the attribute memory 9 (block Sc). When the data of the memory cell that is being scanned matches the scanning mode bit (block Sd), it is determined if the scanned memory cell is the last memory cell of the third portion 9c of the attribute memory 9 (block Se). If the scanned address is not the final address of the third portion 9c of the attribute memory 9, the control circuit 7 controls the scanning counter 92 to increment the address output thereof (block Sf), and the data of another memory cell of the third portion 9c of the attribute memory 9 is compared with the scanning mode bit (block Sd). If the data of the scanned memory cell does not match the scanning mode bit, the control circuit 7 writes at the scanned address such that the data thereat matches the scanning mode bit (block Sg), and the scanning operation is stopped (block Sh). If the data of the scanned memory cell matches the scanning mode bit, and the memory cell that is being scanned is the last memory cell of the third portion 9c of the attribute memory 9, the control circuit 7 toggles the scanning mode register 91 and rewrites the scanning mode bit in the second portion 9b of the attribute memory 9 to a flipped state (block Si). The refresh operation is automatically initiated at this time (block Sj).

A read/write circuit for a controller that can be used in refreshing a two-level memory array in accordance with the method shown in FIG. 1 can be found in the co-pending U.S. patent application Ser. No. 08/611,600. The read/write circuit includes a master latch for storing a new data pattern, a sense amplifier for reading the original data of a corresponding memory cell, a data comparator for comparing the original data with the new data pattern and for generating an erase/program pattern, and a slave latch for storing the erase/program pattern for subsequent operations. The bit-refreshing operation proceeds in a manner generally similar to that described beforehand, except that no step count pattern and stepwise verify voltages are generated, and will not be detailed further.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A method of refreshing a flash memory with a memory array, said method comprising the steps of:

reading data corresponding to that stored in a memory cell of the memory array by applying a read voltage thereto;

applying an erase verify voltage lower than the read voltage to the memory array;

sensing conduction of the memory cell and, based on non-conduction of the memory cell and the data of the memory cell, selectively discharging the memory cell to compensate for undesired charge gain;

applying a program verify voltage higher than the read voltage to the memory array; and sensing conduction of the memory cell and, based on conduction of the memory cell and the data of the memory cell, selectively charging the memory cell to compensate for undesired charge loss.

2. A method of refreshing a flash memory with a multi-level memory array, said method comprising the steps of:

reading data corresponding to that stored in a memory cell of the memory array;

generating a discharge enable signal associated with the memory cell;

generating a step count pattern which has incrementing step counts;

applying stepwise decreasing erase verify signals based on the incrementing step counts to the memory array for reading the memory cell;

comparing the data with a complement of the incrementing step counts, and resetting the discharge enable signal to a discharge inhibit signal when the data is greater than or equal to the complement of the incrementing step counts;

resetting the discharge enable signal to the discharge inhibit signal when the memory cell conducts after applying the erase verify signals corresponding to the incrementing step counts to the memory array; and if the discharge enable signal is still present after applying one of the erase verify signals to the memory array, discharging the memory cell so that a threshold voltage thereof becomes lower than said one of the erase verify signals to cure the memory cell of undesired charge gain.

3. The method of claim 2, further comprising the steps of:

after all of the incrementing step counts have been generated:

generating a charge inhibit signal associated with the memory cell;

generating a step count pattern which has decrementing step counts;

applying stepwise increasing program verify signals based on the decrementing step counts to the memory array for reading the memory cell;

comparing the data with a complement of the decrementing step counts, and resetting the charge inhibit signal to a charge enable signal when the data is greater than or equal to the complement of the decrementing step counts;

resetting the charge enable signal back to the charge inhibit signal when the memory cell does not conduct after applying the program verify signals corresponding to the decrementing step counts to the memory array; and if the charge enable signal is present after applying one of the program verify signals to the memory array, charging the memory cell so that the threshold voltage thereof becomes higher than said one of the program verify signals to cure the memory cell of undesired charge loss.

4. A method of refreshing a flash memory with a multi-level memory array, said method comprising the steps of:

reading data corresponding to that stored in a memory cell of the memory array;

generating a charge inhibit signal associated with the memory cell;

generating a step count pattern which has decrementing step counts;

applying stepwise increasing program verify signals based on the decrementing step counts to the memory array for reading the memory cell;

comparing the data with a complement of the decrementing step counts, and resetting the charge inhibit signal to a charge enable signal when the data is greater than or equal to the complement of the decrementing step counts;

resetting the charge enable signal back to the charge inhibit signal when the memory cell does not conduct after applying the program verify signals corresponding to the decrementing step counts to the memory array; and if the charge enable signal is present after applying one of the program verify signals to the memory array, charging the memory cell so that the threshold voltage thereof becomes higher than said one of the program verify signals to cure the memory cell of undesired charge loss.

5. A method of initiating a refresh operation in a flash memory with a memory array and a refreshing circuit, comprising the steps of:

(A) providing a non-volatile attribute memory having a first memory portion for storing a starting address, a second memory portion for storing a scanning mode bit, and a third memory portion for storing a write cycle record;

(B) during every power-on period, loading the starting address and the scanning mode bit in an address register and a scanning mode register, respectively; and (C) scanning the third memory portion of the attribute memory after each write cycle of the flash memory, including the sub-steps of:

(c1) loading the starting address from the address register into a scanning counter;

(c2) scanning the third memory portion of the attribute memory at an address corresponding to an address output of the scanning counter;

(c3) comparing data at scanned address of the attribute memory with the scanning mode bit;

(c4) if the data matches the scanning mode bit, and the scanned address is not a final address of the attribute memory, controlling the scanning counter to increment the address output thereof for scanning another address of the attribute memory and for comparing data at said another address with the scanning mode bit;

(c5) if the data does not match the scanning mode bit, writing at the scanned address such that the data thereat matches the scanning mode bit, and stopping the scanning of the attribute memory; and (c6) if the data matches the scanning mode bit, and the scanned address is a final address of the attribute memory, controlling the refreshing circuit to start the refresh operation for refreshing the memory array.

6. The method of claim 5, wherein, in step (c6), the scanning mode register is toggled and the scanning mode bit in the second portion of the attribute memory is rewritten to a flipped state when the data matches the scanning mode bit and the scanned address is the final address of the attribute memory.

7. A refreshing circuit for refreshing a flash memory with a multi-level memory array, comprising:

a read-write controller including:

a read/write circuit having: a master latch for latching data corresponding to that stored in a memory cell of the memory array; and a slave latch for generating a discharge enable signal associated with the memory cell; and a step counter for generating a step count pattern which has incrementing step counts;

a voltage generator coupled to said step counter and the memory array, said voltage generator applying stepwise decreasing erase verify signals based on the incrementing step counts from said step counter to the memory array for reading the memory cell;

said read/write circuit further having: a level comparator coupled to said master latch, said step counter and said slave latch, said level comparator comparing the data with a complement of the incrementing step counts, and resetting the discharge enable signal to a discharge inhibit signal when the data is greater than or equal to the complement of the incrementing step counts; and a sense amplifier coupled to the memory array and said slave latch, said sense amplifier sensing conduction of the memory cell after said voltage generator applies the erase verify signals corresponding to the incrementing step counts to the memory array and resetting the discharge enable signal to the discharge inhibit signal when the memory cell conducts;

said read/write controller further including a detecting circuit coupled to said slave latch for detecting presence of the discharge enable signal; and a control circuit coupled to said master latch, said detecting circuit and said voltage generator, said control circuit controlling latching of the data by said master latch upon initiation of a refresh operation, said control circuit being controlled by said detecting circuit to control in turn said voltage generator to permit discharging of the memory cell so that a threshold voltage thereof becomes lower than one of the erase verify signals to cure the memory cell of undesired charge gain upon detection by said detecting circuit that the discharge enable signal is still present after application of said one of the erase verify signals.

8. The refreshing circuit of claim 7, wherein:

said slave latch further generates a charge inhibit signal associated with the memory cell;

said step counter further generating a step count pattern which has a plurality of decrementing step counts after generating all of the incrementing step counts;

said voltage generator further applying stepwise increasing program verify signals based on the decrementing step counts to the memory array for reading the memory cell;

said level comparator further comparing the data with a complement of the decrementing step counts and resetting the charge inhibit signal to a charge enable signal when the data is greater than or equal to the complement of the decrementing step counts;

said sense amplifier further resetting the charge enable signal back to the charge inhibit signal when the memory cell does not conduct after said voltage generator applies the program verify signals corresponding to the decrementing step counts to the memory array; and said detecting circuit further detecting presence of the charge enable signal after said voltage generator applies one of the program verify signals and controlling said control circuit to control, in turn, said voltage generator to permit charging of the memory cell so that the threshold voltage thereof becomes higher than said one of the program verify signals to cure the memory cell of undesired charge loss.

9. The refreshing circuit of claim 7, wherein said control circuit is adapted to receive a command set from an off-chip controller to initiate the refresh operation.

10. The refreshing circuit of claim 7, further comprising a sequencer coupled to and controlled by said control circuit so as to generate address data internally for accessing the memory cells of the memory array sequentially during the refresh operation.

11. The refreshing circuit of claim 7, further comprising automatic means coupled to said control circuit for initiating the refresh operation, said automatic means comprising:

a non-volatile attribute memory coupled to said control circuit and having a first memory portion for storing a starting address, a second memory portion for storing a scanning mode bit, and a third memory portion for storing a write cycle record;

an address register coupled to said control circuit and said attribute memory, said control circuit loading the starting address into said address register during every power-on period;

a scanning mode register coupled to said control circuit and said attribute memory, said control circuit loading the starting mode bit into said scanning mode register during every power-on period; and a scanning counter coupled to said address register and said control circuit;

said control circuit loading the starting address from said address register into said scanning counter so as to scan said third memory portion of said attribute memory at an address corresponding to an address output of said scanning counter after each write cycle of the flash memory, said control circuit comparing data at scanned address of said attribute memory with the scanning mode bit;

if the data matches the scanning mode bit, and the scanned address is not a final address of said attribute memory, said control circuit controlling said scanning counter to increment the address output thereof for scanning another address of said attribute memory and for comparing data at said another address with the scanning mode bit;

if the data does not match the scanning mode bit, said control circuit writing at the scanned address such that the data thereat matches the scanning mode bit, and stopping the scanning of said attribute memory; and if the data matches the scanning mode bit, and the scanned address is a final address of said attribute memory, said control circuit initiating the refresh operation for refreshing the memory array.

12. The refreshing circuit of claim 11, wherein said control circuit toggles said scanning mode register and rewrites the scanning mode bit in said second portion of said attribute memory to a flipped state when the data matches the scanning mode bit and the scanned address is the final address of said attribute memory.

13. A refreshing circuit for refreshing a flash memory with a multi-level memory array, comprising:

a read-write controller including:

a read/write circuit having: a master latch for latching data corresponding to that stored in a memory cell of the memory array; and a slave latch for generating a charge inhibit signal associated with the memory cell; and a step counter for generating a step count pattern which has decrementing step counts;

a voltage generator coupled to said step counter and the memory array, said voltage generator applying stepwise increasing program verify signals based on the decrementing step counts from said step counter to the memory array for reading the memory cell;

said read/write circuit further having: a level comparator coupled to said master latch, said step counter and said slave latch, said level comparator comparing the data with a complement of the decrementing step counts and resetting the charge inhibit signal to a charge enable signal when the data is greater than or equal to the complement of the decrementing step counts; and a sense amplifier coupled to the memory array and said slave latch, said sense amplifier sensing conduction of the memory cell after said voltage generator applies the program verify signals corresponding to the decrementing step counts to the memory array and resetting the charge enable signal back to the charge inhibit signal when the memory cell does not conduct;

said read/write controller further including a detecting circuit coupled to said slave latch for detecting presence of the charge enable signal; and a control circuit coupled to said master latch, said detecting circuit and said voltage generator, said control circuit controlling latching of the data by said master latch upon initiation of a refresh operation, said control circuit being controlled by said detecting circuit to control in turn said voltage generator to permit charging of the memory cell so that a threshold voltage thereof becomes higher than one of the program verify signals to cure the memory cell of undesired charge loss upon detection by said detecting circuit that the charge enable signal is still present after application of said one of the program verify signals.

14. The refreshing circuit of claim 13, wherein said control circuit is adapted to receive a command set from an off-chip controller to initiate the refresh operation.

15. The refreshing circuit of claim 13, further comprising a sequencer coupled to and controlled by said control circuit so as to generate address data internally for accessing the memory cells of the memory array sequentially during the refresh operation.

16. The refreshing circuit of claim 13, further comprising automatic means coupled to said control circuit for initiating the refresh operation, said automatic means comprising:

a non-volatile attribute memory coupled to said control circuit and having a first memory portion for storing a starting address, a second memory portion for storing a scanning mode bit, and a third memory portion for storing a write cycle record;

an address register coupled to said control circuit and said attribute memory, said control circuit loading the starting address into said address register during every power-on period;

a scanning mode register coupled to said control circuit and said attribute memory, said control circuit loading the starting mode bit into said scanning mode register during every power-on period; and a scanning counter coupled to said address register and said control circuit;

said control circuit loading the starting address from said address register into said scanning counter so as to scan said third memory portion of said attribute memory at an address corresponding to an address output of said scanning counter after each write cycle of the flash memory, said control circuit comparing data at scanned address of said attribute memory with the scanning mode bit;

if the data matches the scanning mode bit, and the scanned address is not a final address of said attribute memory, said control circuit controlling said scanning counter to increment the address output thereof for scanning another address of said attribute memory and for comparing data at said another address with the scanning mode bit;

if the data does not match the scanning mode bit, said control circuit writing at the scanned address such that the data thereat matches the scanning mode bit, and stopping the scanning of said attribute memory; and if the data matches the scanning mode bit, and the scanned address is a final address of said attribute memory, said control circuit initiating the refresh operation for refreshing the memory array.

17. The refreshing circuit of claim 16, wherein said control circuit toggles said scanning mode register and rewrites the scanning mode bit in said second portion of said attribute memory to a flipped state when the data matches the scanning mode bit and the scanned address is the final address of said attribute memory.

18. An automatic circuit for initiating a refresh operation in a flash memory with a memory array and a refreshing circuit, said automatic circuit comprising:

a non-volatile attribute memory coupled to the refreshing circuit and having a first memory portion for storing a starting address, a second memory portion for storing a scanning mode bit, and a third memory portion for storing a write cycle record;

an address register coupled to the refreshing circuit and said attribute memory, the refreshing circuit loading the starting address into said address register during every power-on period;

a scanning mode register coupled to the refreshing circuit and said attribute memory, the refreshing circuit loading the starting mode bit into said scanning mode register during every power-on period; and a scanning counter coupled to said address register and the refreshing circuit;

the refreshing circuit loading the starting address from said address register into said scanning counter so as to scan said third memory portion of said attribute memory at an address corresponding to an address output of said scanning counter after each write cycle of the flash memory, the refreshing circuit comparing data at scanned address of said attribute memory with the scanning mode bit;

if the data matches the scanning mode bit, and the scanned address is not a final address of said attribute memory, the refreshing circuit controlling said scanning counter to increment the address output thereof for scanning another address of said attribute memory and for comparing data at said another address with the scanning mode bit;

if the data does not match the scanning mode bit, the refreshing circuit writing at the scanned address such that the data thereat matches the scanning mode bit, and stopping the scanning of said attribute memory; and if the data matches the scanning mode bit, and the scanned address is a final address of said attribute memory, the refreshing circuit initiating the refresh operation for refreshing the memory array.

19. The automatic circuit of claim 18, wherein the refreshing circuit toggles said scanning mode register and rewrites the scanning mode bit in said second portion of said attribute memory to a flipped state when the data matches the scanning mode bit and the scanned address is the final address of said attribute memory.

* * * * *